United States Patent [19]
Yonemochi et al.

[11] Patent Number: 4,951,119
[45] Date of Patent: Aug. 21, 1990

[54] LEAD FRAME FOR SEMICONDUCTOR DEVICES

[75] Inventors: Kazuto Yonemochi, Shimotakai; Akio Imoto, Koshoku; Tokuji Harada, Suzaka, all of Japan

[73] Assignee: Shinko Electric Industries, Co., Ltd., Nagano, Japan

[21] Appl. No.: 307,841

[22] Filed: Feb. 8, 1989

[30] Foreign Application Priority Data

Feb. 8, 1988 [JP] Japan .................................. 63-27274

[51] Int. Cl.[5] ........................................... H01L 23/48
[52] U.S. Cl. ...................................... 357/70; 357/72; 357/74; 437/220
[58] Field of Search ............................ 357/70, 72, 74; 437/220

[56] References Cited

U.S. PATENT DOCUMENTS

| | | | |
|---|---|---|---|
| 3,727,064 | 4/1973 | Bottini | 357/70 |
| 4,301,464 | 11/1981 | Otsuki et al. | 357/72 |
| 4,663,651 | 5/1987 | Gilder, Jr. et al. | 357/70 |

FOREIGN PATENT DOCUMENTS

2173342A 10/1986 United Kingdom .................. 357/74

Primary Examiner—Rolf Hille
Assistant Examiner—Steven Loke
Attorney, Agent, or Firm—Staas & Halsey

[57] ABSTRACT

A lead frame for semiconductor devices comprises a plurality of lead sets, each made of a metal strip of a plurality of leads arranged side by side with a small clearance therebetween and a connecting member for integrally connecting the leads. A plurality of such lead sets are arranged in desired positions with respect to each other to form a lead frame assembly.

6 Claims, 9 Drawing Sheets

LEAD FRAME FOR SEMICONDUCTOR DEVICES,

BACKGROUND OF THE INVENTION

1. Field of the Invention

This invention relates to a lead frame for semiconductor devices, and more particularly, to a lead frame having a plurality of leads for connecting electrodes of a semiconductor chip accommodated in a package to external terminals. This invention also relates to a process for making such a lead frame for semiconductor devices.

2. Description of the Related Art

A conventionally known semiconductor device has a semiconductor chip accommodated in a package made of resin, ceramic or the like. Usually, a lead frame therefor is formed by integrally stamping or punching a thin metal strip, or etching the same and providing a plurality of leads which are used for connecting electrodes of a semiconductor chip accommodated in the package to external terminals.

Such a lead frame is usually formed as a longitudinal strip of continuous segments of lead frame units connected in series in the longitudinal direction. Each lead frame unit includes a square-shaped stage for mounting a semiconductor chip thereon and a plurality of leads radially arranged side by side with a small clearance therebetween at peripheral regions of the respective sides of the stage.

The semiconductor chip is provided with a plurality of electrodes on the periphery of a chip surface, but the number or arrangement of such electrodes differs for each individual semiconductor chip, according to the purpose, function, use or the like thereof.

Therefore, conventionally various kinds of lead frames must be prepared in order to adapt them to the various kinds of semiconductor chips, i.e., a particular lead frame has a predetermined number and arrangement of leads adapted to a semiconductor chip in question. Thus precision dies must be used to form the various kinds of lead frames, thereby increasing manufacturing costs.

To form a lead frame in which a plurality of leads are arranged at the peripheral regions of a square-shaped stage, with the tips of the respective leads coated with an aluminum thin film, the following steps are conventionally required. Namely, a lead frame is first formed by integrally stamping or punching a thin metal strip, or etching the same. The leads distributed in the four peripheral regions are then subjected to, for example, vacuum vapor deposition, to deposit aluminum onto the tips of the leads of each lead frame unit. Accordingly, large-scale machinery, such as a vacuum vapor deposition apparatus or the like, and much labor are required.

SUMMARY OF THE INVENTION

Accordingly, an object of the present invention is to provide a lead frame for semiconductor devices, by making various kinds of such lead frames wherein the number and arrangement of the leads of each lead frame are different, with a smaller number of simple metal molds.

Another object of the present invention is to provide a lead frame for semiconductor devices, whereby the tips of the leads of the lead frame are easily coated with a thin film of aluminum.

According to an aspect of the present invention, there is provided a process for making a lead frame comprising a plurality of lead sets, each lead set comprising a plurality of leads arranged side by side with a small clearance therebetween and at least one connecting member for integrally connecting the leads, the process including the following steps of: stamping or punching a metal strip to form a series of lead sets connected to a frame structure of the metal strip; removing the lead sets from the frame structure of the metal strip; and arranging a plurality of the lead sets in such a manner that they form a lead frame assembly.

This process makes it possible to form various kinds of lead frames wherein the number and arrangement of the leads of each lead frame is different, with a smaller number of simple metal molds.

In this process for making a lead frame, the tips of the leads can be coated with a thin film of aluminum, before the lead sets are removed from the frame structure, thus making it possible to easily and quickly deposit the thin film of aluminum onto the tips of the leads.

According to another aspect of this invention, there is provided a lead frame for semiconductor devices, including: a plurality of lead sets; each lead set made of a metal strip having a plurality of leads arranged side by side with a small clearance therebetween and at least one connecting member for integrally connecting the leads; the plurality of lead sets being arranged in such as manner that they form a lead frame assembly.

DESCRIPTION OF THE PREFERRED EMBODIMENTS

Referring now to the drawings, in which FIGS. 1 to 6 illustrate a first embodiment of this invention, a lead frame 10a comprises a longitudinal strip of continuous segments each having a central square-shaped stage 5 and a plurality of leads 1 arranged radially at the peripheral regions of four sides of the stage 5. This lead frame 10a can be advantageously used for, for example, resin-molded type semiconductor devices.

Figure 1:
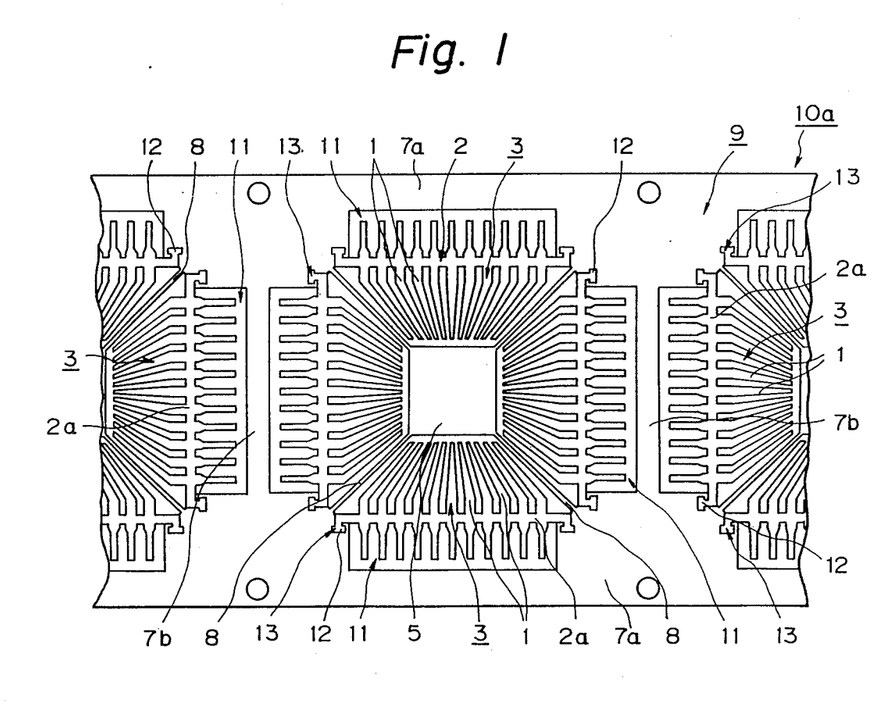
FIG. 1 is a plan view of a lead frame according to this invention.

Four lead collections or sets 3 having the same-size and shape (hereinafter, simply referred to as "lead set") are arranged at the four peripheral regions of the stage 5, respectively, and each of the lead sets 3 comprises a plurality of leads 1 arranged radially side by side in a plane, with a small clearance therebetween to form a comb-like configuration. The leads 1 are integrally connected to each other in series by a dam bar 2a provided at the intermediate portions of the respective leads 1.

Figure 2:
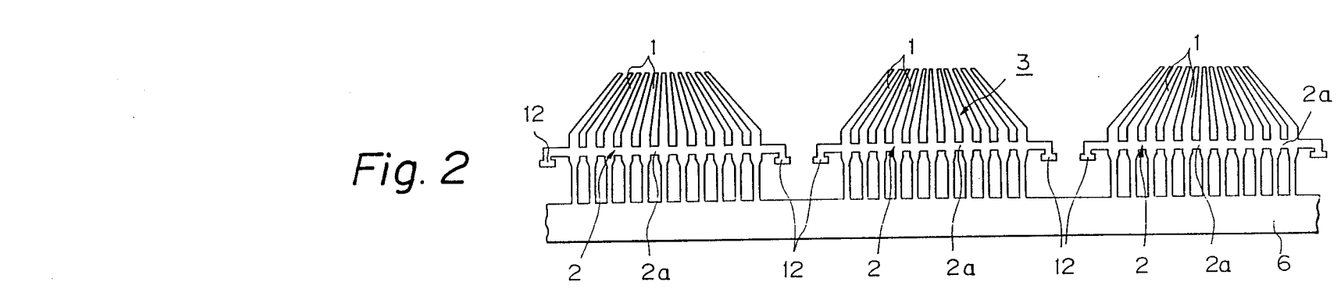
FIGS. 2 and 3 are plan views of embodiments of lead sets for forming a lead frame of FIG. 1.
Figure 3:
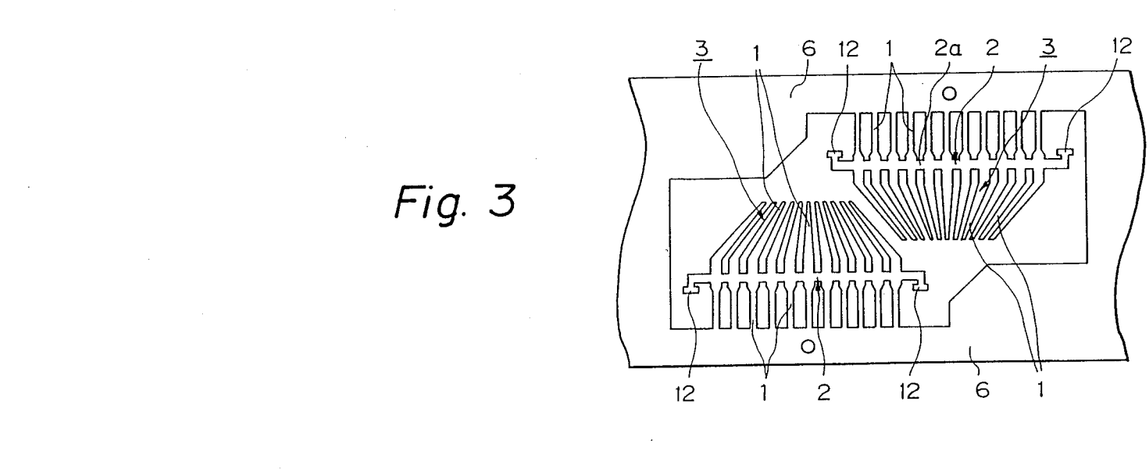

The lead sets 3 may be formed by any known method, e.g., by stamping or punching a thin metal strip in such a manner that a plurality of the lead sets 3 are integrally formed and arranged continuously in the longitudinal direction on a tie bar 6, as shown in FIG. 2. Alternatively, a plurality of the lead sets 3 can be integrally formed and arranged in a zig-zag pattern between upper and lower tie bars 6, as shown in FIG. 3.

Although, in the above-mentioned embodiment, the number and shape of the leads 1 in the respective four lead sets 3 are the same for all of the four lead sets 3, the number and shape thereof may be changed for each individual lead set.

Figure 4:
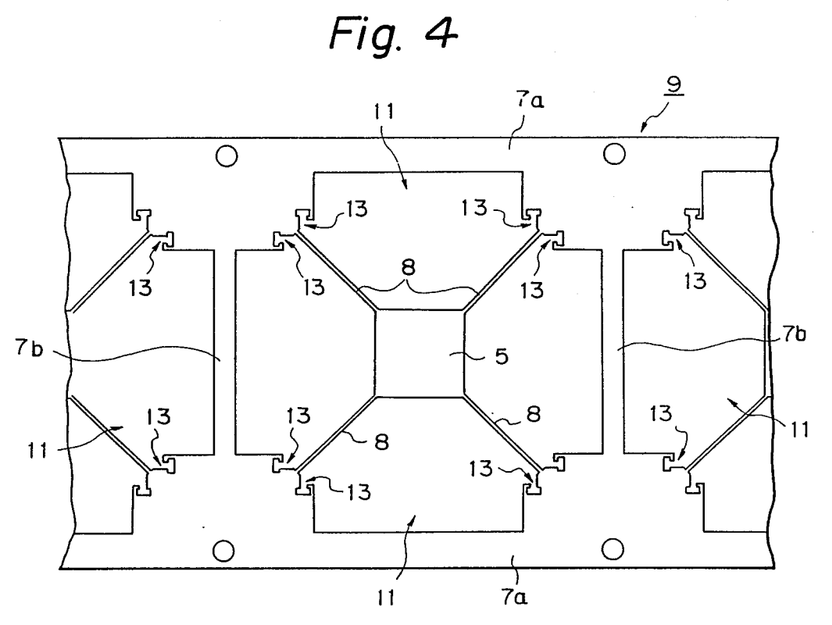
FIG. 4 is a plan view of a stage forming member for a lead frame of FIG. 1.

In FIG. 4, stage forming members 9 also can be formed by any known method, e.g., by stamping or punching a longitudinal thin metal strip in such a manner that a plurality of such stage forming members 9 are integrally formed and arranged continuously in the longitudinal direction, and comprise upper and lower guide rails 7a and section bars 7b transversely arranged to integrally connect the upper and lower guide rails 7a. The individual stage forming members 9 are defined between these upper and lower guide rails 7a and between the left and right section bars 7b. At the center of the stage forming member 9, a stage 5 is provided which is supported by four stage support bars 8 extending along diagonal lines from the respective four corners of the stage 5 to the guide rails 7a or section bars 7b. The stage forming member 9 is provided with four openings 11, having the same shape and size, defined between the stage 5, adjacent to two stage support bars 8, and the guide rails 7a or section bars 7b. These openings 11 correspond to the openings of the lead frame 10a in FIG. 1, which would remain if the plurality of leads 1, i.e., lead sets 3, were removed therefrom.

These lead sets 3 are removed from the tie bar 6 (FIGS. 2 and 3) and inserted into the respective openings 11 of the stage forming body 9 in such a manner that each of the lead sets 3 is arranged at a required position with respect to, and on the same plane as, the stage forming member 9. To facilitate this insertion, the lead set 3 is provided with a pair of rectangularshaped projections 12 at the respective ends of the connecting bar 2, as shown in FIGS. 2 or 3. The stage forming member 9 is provided with corresponding rectangular-shaped recesses 13 into which the projections 12 are fitted.

The lead frame 1 as shown in FIG. 1 may be formed as mentioned above, but in practice, advantageously the lead sets 3 are immovably located at predetermined positions in the openings 11 by a fixing means such as a strip (FIG. 5) or square of (FIG. 6) insulating adhesive tape 14 made of a resin, for example, polyimide, extended over and adhered to at least two adjacent lead sets 3 and the stage support bars 8 of the stage forming body 9.

In general, many kinds of lead frames can be provided, such as shown at 10a in FIG. 1, which include a plurality of lead sets 3 having the same number and arrangement of leads 1 or the same shape leads 1. Accordingly, a large number of common lead sets 3 can be used to obtain a required lead frame 10a. Thus, only one or a very few precision metal molds are required to form such a lead frame 10a.

According to the present invention, a lead frame 10a is not integrally formed as a whole, but is formed by rearranging a plurality of lead sets 3 and a stage forming member 9 which have been formed independently, and therefore, simple and smaller precision metal molds can be used for forming such independent members.

Several precision metal molds can be advantageously provided to form different kinds of lead sets 3 having a different number of shape of leads 1. In this case, a desired lead frame such as shown at 10a, which is suitable for any purpose, having the desired lead sets 3 arranged at the peripheral regions of the four sides of the stage 5 can be easily and optionally formed by selecting lead sets 3 having a desired number and shape of leads 1.

In the lead frame 10a of the first embodiment, the material of the lead sets 3 may be the same as or different from that of the stage forming member 9. Accordingly, the material of the lead sets 3 may be selected so that wires can be stably connected to tips of the leads 1 in a reliable manner. Alternatively, any material having high thermal dispersion characteristics can be advantageously selected as the stage forming member 9.

Another embodiment of this invention will now be described with reference to FIGS. 7 to 9. The lead frame 10b can be made of an alloy of Fe—Ni—Co, Fe—Ni, or the like, and advantageously used for, e.g., cerdip-type semiconductor devices. The lead frame 10b comprises a plurality of leads 1 arranged radially at the peripheral regions of four sides of a square-shaped central opening 15 and supported at the outer ends thereof by connecting bars 2, i.e., upper and lower guide rails 7a and left and right section bars 7b. In this lead frame 10b, a thin aluminum film is coated on the surfaces of the inner ends (tips) of the leads 1, to enable bonding wires (not shown) to be connected to the tips of the lead 1 by a bonding process such as ultra sonic wire bonding.

The lead frame 10b comprises four lead sets 3 having the same size and shape and each comprising a plurality of leads 1 arranged side by side in a plane with a small clearance therebetween, to form a comb-like configuration. The outer ends of the leads 1 are integrally connected to connecting members 2, i.e., upper and lower guide rails 7a and left and right section bars 7b.

Figure 8:
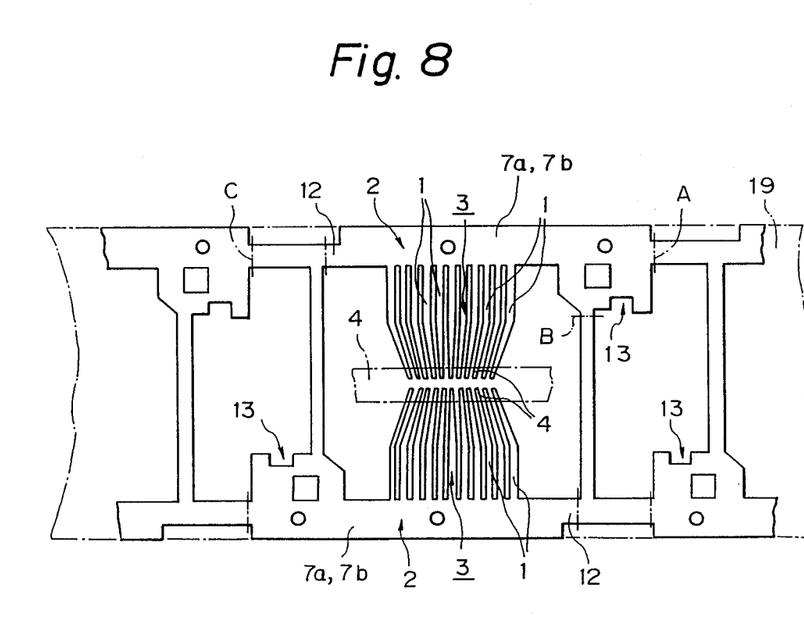
FIG. 8 is a plan view of lead sets for forming a lead frame of FIG. 7.

The lead sets 3 are advantageously formed by stamping or punching a thin metal strip made of an alloy of Fe—Ni—Co, Fe—Ni, or the like, and having a longitudinal center strip portion 4, as shown in FIG. 8, corresponding to the region of the tips of the leads 1, which portion 4 is already coated with an aluminum thin film by, for example, a cladding process. In this embodiment, a plurality of lead sets 3 are formed in such a manner that corresponding pairs of the plurality of leads 1 are arranged opposite to each other between the upper and lower connecting members 2 forming the guide rails 7a and section bars 7b,. Thus, the aluminum thin film can easily be deposited onto the tips of the respective leads 1. Although, in this embodiment, the number and shape of the leads 1 are the same for each of the four lead sets 3, respectively, the number and shape thereof may be changed to suit a particular purpose.

These lead sets 3 and the guide rails 7a and section bars 7b are cut off along lines A, B, and C in FIG. 8 and removed from the support frame 20. Then, four of the lead sets 3 are arranged on the same plane in predetermined positions with respect to each other and assembled to form a lead frame 10b as shown in FIG. 7, in which a plurality of leads 1 are radially arranged at the peripheral regions of four sides of a square-shaped central opening 15 and supported at the outer ends thereof by the upper and lower guide rails 7a and left and right section bars 7b, as mentioned above. To facilitate this assembly, each of the lead sets 3 is provided with a projection 12 at one end of the guide rail 7a or section bar 7b and, with a corresponding recess 13 at the other end thereof into which the projection 12 can be fitted, as shown in FIGS. 7 and 8.

Figure 7:
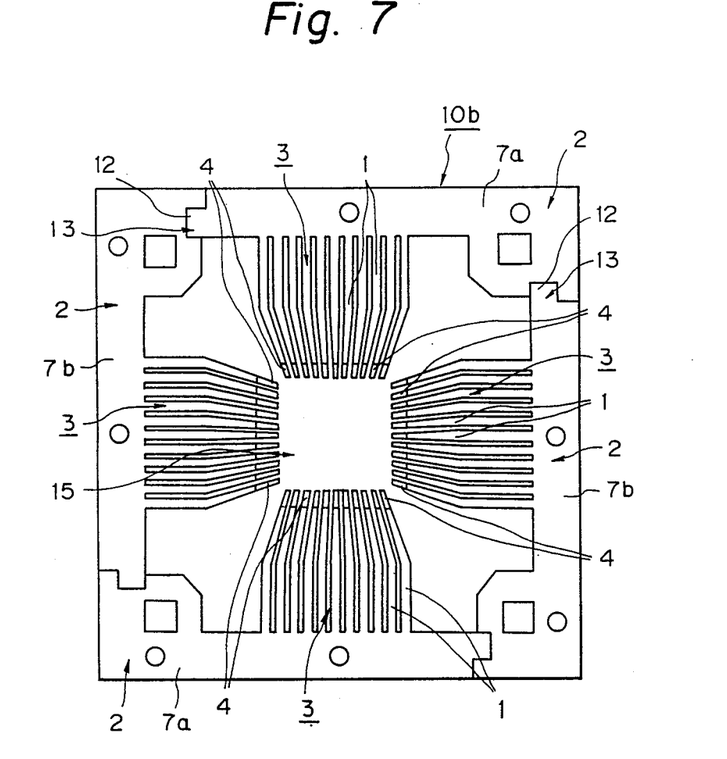
FIG. 7 is a plan view of another lead frame according to the present invention.
Figure 9A:
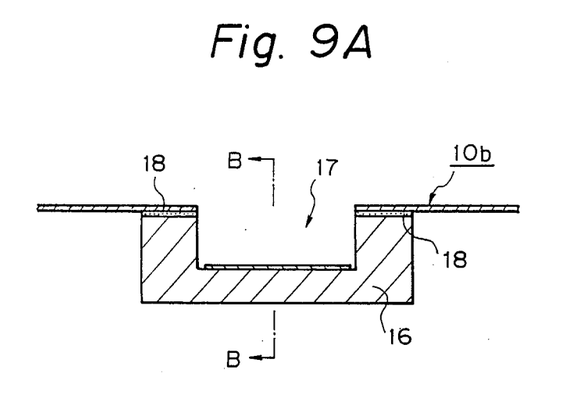
FIG. 9A is a cross-sectional view of a package in which the upper peripheral surface of a ceramic base is covered with the lead frame of FIG. 7.
Figure 9B:
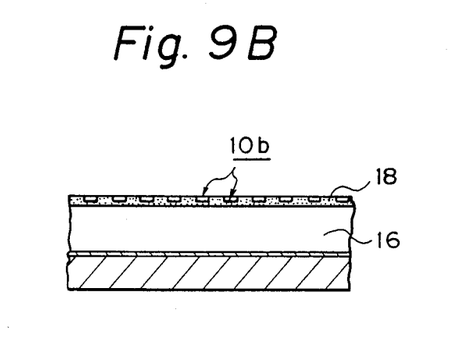
FIG. 9B is a cross-sectional view taken along a line B—B in FIG. 9A.

The lead frame 10b as shown in FIG. 7 may be formed as mentioned above, but in practice, advantageously, as shown in FIGS. 9A and 9B, the lead frame 10b is immovably fixed on a ceramic base 16 in such a manner that the bottom and side surfaces of the respective leads 1 of the lead sets 3 are buried in and adhered to a low-melting-point glass 18 provided on an upper peripheral surface of the ceramic base 16 constituting a semiconductor package.

Figure 5:
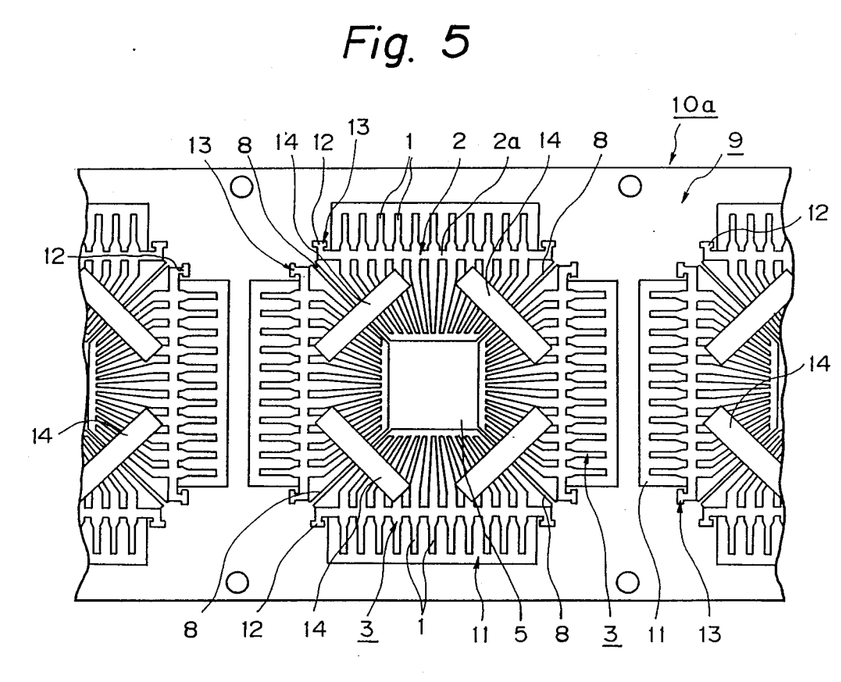
FIGS. 5 and 6 are plan views of a lead frame of FIG. 1 in which lead sets are assembled with a stage forming member by adhesive tape.
Figure 6:
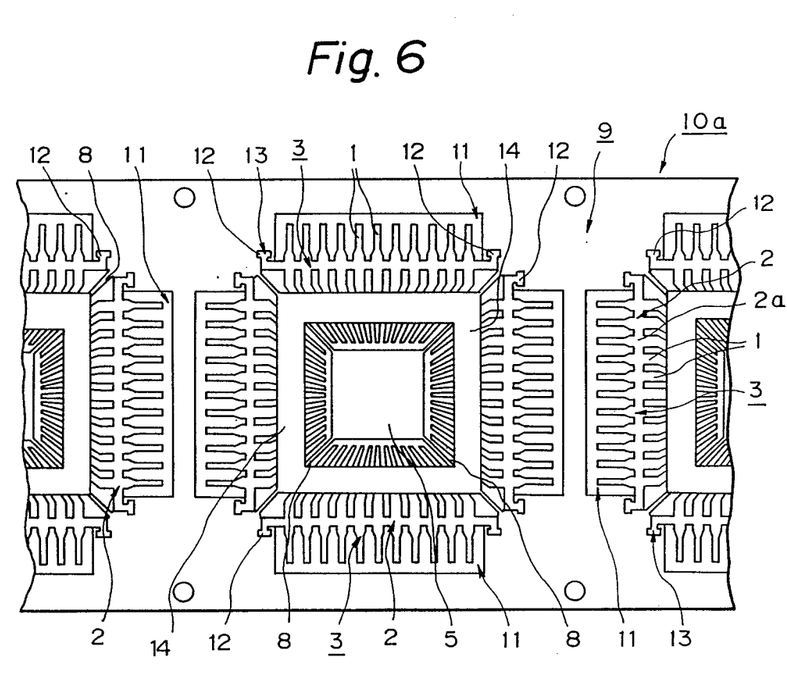

Alternatively, the lead frame 10b may be formed in such a manner that an insulating adhesive tape (not shown) is arranged to extend over and adhere to adjacent lead sets 3 to immovably fix them with respect to each other in the same manner as in the previous embodiment. It is also possible to use a longitudinal lead frame 10a, as shown in FIG. 5, accompanying the lead sets 3 assembled to a stage forming member 9 as mentioned above, to obtain a lead frame for a cerdip-type semiconductor device.

According to this embodiment, a lead frame 10b having a desired number and arrangement of leads 1 can be easily obtained by assembling a plurality of lead sets 3 which already have been formed separately by using precision metal molds for forming such lead sets 3.

In the same manner as in the previous embodiment, it is possible to easily and optionally form any desired lead frame 10b having any desired number and shape of leads 1 arranged at the peripheral regions of the four sides of the square-shaped opening 15 and between the upper and lower guide rails 7a or the left and right section bars 7b, by selecting and rearranging desired lead sets 3 having the desired number and shape of the leads 1.

To form the lead frame 10a or 10b of the above-mentioned embodiments, it is also possible to arrange the lead sets 3 or the stage forming member 9 in such a manner that a part thereof overlaps the adjacent one, and fix them together by, for example, projection welding of the overlapped portions.

Although the lead frames 10a and 10b of the above embodiments are a quad-type lead frame having a plurality of leads at four peripheral regions thereof, this invention can be, of course, applied to a lead frame having a plurality of leads arranged in two regions opposite to each other (i.e., dual-type), or three or five or more regions, around the central stage or opening.

Figure 10:
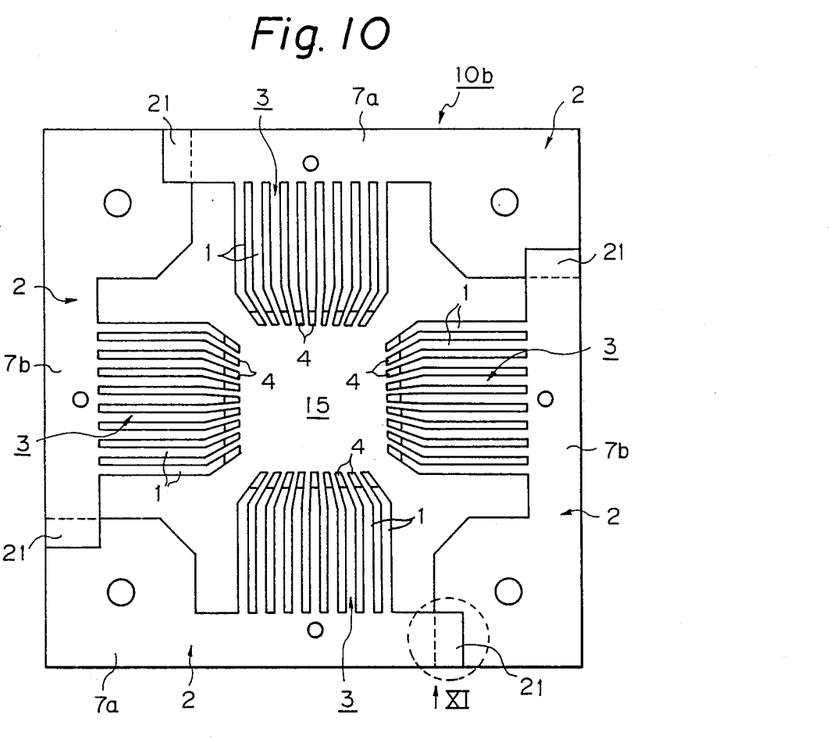
FIG. 10 is a plan view of still another embodiment of a lead frame of this invention; and, FIGS. 11A and 11B are views seen from Arrow XI of FIG. 10.
Figure 11A:
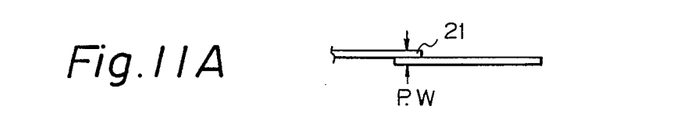
Figure 11B:
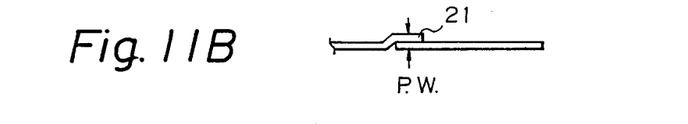

For example, as shown in FIG. 10, each of the lead sets 3 is provided with an extension 21 at one end of the guide rail 7a or section bar 7b to overlap the adjacent one. As shown in Fig. 11A or 11B, the extension 21 is fixed to the adjacent one by projection welding.

We claim:

1. A lead frame for semiconductor devices, comprising:
   a plurality of lead sets;
   each lead set being made of a metal strip including a plurality of leads arranged side by side with a small clearance therebetween and at least one connecting member for integrally connecting said leads;
   said plurality of lead sets being arranged in desired positions with respect to each other to form a lead frame assembly,
   wherein said connecting member includes a projection at one end thereof and a corresponding recess at the other end thereof, said projection of one lead set being fittable into a recess of an adjacent lead set, so that the plurality of lead sets are coplanar.

2. A lead frame as claimed in claim 1 wherein four of said lead sets are arranged in a plane and being positioned such that said connecting members define a substantially square-shaped periphery of said lead frame assembly, said leads extending inward to form a square-shaped opening which is defined by tips of said leads positioned along four sides of said opening.

3. A lead frame for semiconductor devices, comprising:
   a plurality of lead sets, each lead set being made of a metal strip including a plurality of leads arranged side by side with a small clearance therebetween and at least one connecting member for integrally connecting said leads;
   a stage support member made of a metal strip including a stage for mounting a semiconductor chip thereon, a frame structure including at least a pair of upper and lower rails defining respective side edges of said metal strip, and support bars extending from said stage to said frame structure, so that openings are defined between said stage and said frame structure and between said adjacent support bars, said stage, frame structure and support bars being coplanar; and
   said plurality of lead sets being arranged in positions in said openings of the stage support member such that tips of said leads are arranged opposite to a periphery of said stage;
   wherein said connecting member is provided at respective ends thereof with projections and said stage support member is provided with corresponding recesses so that said projections of said lead sets are fitted into said corresponding recesses of said stage support member so that the plurality of lead sets, the stage, frame structure and support bars are coplanar.

4. A lead frame as claimed in claim 3, wherein said stage support member has four of said openings and said stage is substantially square-shaped, so that four of said lead sets are arranged in desired positions in said opening.

5. A lead frame for semiconductor devices, comprising:
   a plurality of lead sets, each lead set being made of a metal strip including a plurality of leads arranged side by side with a small clearance therebetween and at least one connecting member for integrally connecting said leads;
   a stage support member made of a metal strip including a stage for mounting a semiconductor chip thereon, a frame structure including at least a pair of upper and lower rails defining respective side edges of said metal strip, and support bars extending from said stage to said frame structure, so that openings are defined between said stage and said frame structure and between said adjacent support bars, said stage, frame structure and support bars being coplanar; and
   said plurality of lead sets being arranged in positions in said openings of the stage support member such that tips of said leads are arranged opposite to a periphery of said stage, and wherein, said connecting member is provided at respective ends thereof with recesses and said stage support member is provided with corresponding projections so that said recesses of said connecting member are fitted into said corresponding projections of said stage support member.

6. A lead frame as claimed in claim 5, wherein said stage support member has four of said openings and said stage is substantially square-shaped, so that four of said lead sets are arranged in desired positions in said opening.

* * * * *